(12) United States Patent
Liang et al.

(10) Patent No.: US 10,350,726 B2
(45) Date of Patent: Jul. 16, 2019

(54) CHEMICAL MECHANICAL POLISHING SYSTEM AND METHOD

(71) Applicant: Taiwan Semiconductor Manufacturing Co., Ltd., Hsin-Chu (TW)

(72) Inventors: Chin-Wei Liang, Zhubei (TW); Hsun-Chung Kuang, Hsinchu (TW); Yen-Chang Chu, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 40 days.

(21) Appl. No.: 15/626,612

(22) Filed: Jun. 19, 2017

(65) Prior Publication Data
US 2018/0361529 A1   Dec. 20, 2018

(51) Int. Cl.
*B24B 37/04* (2012.01)
*H01L 21/304* (2006.01)

(52) U.S. Cl.
CPC ........ *B24B 37/046* (2013.01); *B24B 37/042* (2013.01); *H01L 21/304* (2013.01)

(58) Field of Classification Search
CPC ..................... B24B 37/046; B24B 37/042
USPC ............................. 451/65, 285–290
See application file for complete search history.

(56) References Cited

U.S. PATENT DOCUMENTS

| | | | | |
|---|---|---|---|---|
| 5,688,364 A | * | 11/1997 | Sato | B24B 1/04 156/345.12 |
| 5,911,619 A | * | 6/1999 | Uzoh | B24B 37/26 204/224 M |
| 6,066,030 A | * | 5/2000 | Uzoh | B24B 37/046 451/287 |
| 6,297,159 B1 | * | 10/2001 | Paton | B24B 1/005 216/88 |
| 6,368,190 B1 | * | 4/2002 | Easter | B24B 37/046 451/287 |

(Continued)

OTHER PUBLICATIONS

J. Luo and D. A. Dornfeld. Excerpt from "Integrated Modeling of Chemical Mechanical Planarization for Sub-Micron IC Fabrication: From Particle Scale to Feature, Die and Wafer Scales." Chapter entitled "Modeling of CMP." ISBN 3-540-22369-x Springer-Verlag, 2004.

*Primary Examiner* — George B Nguyen
(74) *Attorney, Agent, or Firm* — Eschweiler & Potashnik, LLC (57) ABSTRACT

The present disclosure relates to a chemical mechanical polishing (CMP) system, and an associated method to perform a CMP process. In some embodiments, the CMP system has a rotatable wafer carrier configured to hold a wafer face down to be processed. The CMP system also has a polishing layer attached to a polishing platen and having a front surface configured to interact with the wafer to be processed, and a CMP dispenser configured to dispense a slurry between an interface of the polishing layer and the wafer. The slurry contains charged abrasive particles therein. The CMP system also has a film electrode attached to a back surface of the polishing layer opposite to the front surface. The film electrode is configured to affect movements of the charged abrasive particles through applying an electrical field during the operation of the CMP system.

20 Claims, 5 Drawing Sheets

(56) References Cited

U.S. PATENT DOCUMENTS

| | | | | |
|---|---|---|---|---|
| 6,689,258 B1* | 2/2004 | Lansford | ............... | B23H 5/08 |
| | | | | 204/224 M |
| 6,722,950 B1* | 4/2004 | Dabral | ............... | B23H 5/08 |
| | | | | 257/E21.583 |
| 6,739,953 B1* | 5/2004 | Berman | ............... | B24B 37/042 |
| | | | | 438/622 |
| 6,858,531 B1* | 2/2005 | Zhu | ............... | B23H 5/08 |
| | | | | 257/E21.583 |
| 8,758,090 B2* | 6/2014 | Shao | ............... | B24B 37/34 |
| | | | | 156/345.12 |
| 9,227,294 B2* | 1/2016 | Cheng | ............... | B24B 37/013 |
| 2002/0098698 A1* | 7/2002 | Kojima | ............... | B24B 37/042 |
| | | | | 438/691 |
| 2003/0129927 A1* | 7/2003 | Lee | ............... | B23H 3/00 |
| | | | | 451/41 |
| 2003/0178320 A1* | 9/2003 | Liu | ............... | B23H 3/08 |
| | | | | 205/640 |
| 2004/0020789 A1* | 2/2004 | Hu | ............... | B23H 5/08 |
| | | | | 205/666 |
| 2004/0082289 A1* | 4/2004 | Butterfield | ............... | B23H 5/06 |
| | | | | 451/526 |
| 2004/0142641 A1* | 7/2004 | Ohno | ............... | B24B 3/24 |
| | | | | 451/41 |
| 2010/0231088 A1* | 9/2010 | Kobayashi | ............... | B24B 37/08 |
| | | | | 310/311 |
| 2013/0137263 A1 | 5/2013 | Chen et al. | | |
| 2014/0120724 A1* | 5/2014 | Sung | ............... | B24B 53/017 |
| | | | | 438/692 |
| 2014/0323017 A1* | 10/2014 | Tang | ............... | B24B 53/017 |
| | | | | 451/56 |

* cited by examiner

CHEMICAL MECHANICAL POLISHING SYSTEM AND METHOD

BACKGROUND

In the manufacture of integrated circuits (ICs), devices are formed on a wafer by forming various process layers, then selectively removing or patterning portions of those layers and depositing additional process layers thereon. After deposition steps, an uppermost surface of the wafer is usually non-planar because of previous selective patterning. A planarization process is performed in succession to remove excess portions and prepare a flat surface for the following process.

A chemical-mechanical polishing process (CMP process) is utilized for the planarization process. The wafer to be processed is held upside down and forced against a rotating CMP pad. A slurry is disposed between the CMP pad and wafer surface. Due to the applied down force, this slurry, which includes chemicals that help chemically dissolve the uppermost surface of the wafer and abrasive particles that help physically wear away the uppermost surface, provides for wafer surface planarization.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Chemical-mechanical polishing (CMP) is a process utilized in the semiconductor fabrication industry for planarization. In a CMP process, a slurry including chemicals and abrasive particles is applied to an interface between a wafer and a CMP pad. The chemicals react with the contacting wafer material to soften or further dissolve the uppermost layer of the wafer. The abrasive particles, together with asperities of the polishing pad in some cases, mechanically dislocate and deform the uppermost layer of the contacting wafer material. As a result, the chemicals and the abrasive particles collectively remove a non-planar portion of the wafer to achieve a planar upper surface. The chemical effects of the CMP process are "soft" and slow, compared to the mechanical effects, which remove the wafer material faster but may introduce defects and unevenness to the top surface of the wafer.

The present disclosure relates to a CMP system which includes a CMP pad having a film electrode attached to a polishing layer, and associated methods. During an operation of the CMP system, an electrical field is applied through the film electrode to affect movements of charged abrasive particles, and to further control removal rate and removal uniformity of a wafer to be processed. In some embodiments, the CMP system comprises a rotatable wafer carrier configured to hold a wafer face down to be processed. A polishing layer is attached to a polishing platen, and has a front surface configured to interact with the wafer to be processed. A CMP dispenser is configured to dispense a slurry between an interface of the polishing layer and the wafer. The slurry contains charged abrasive particles therein. A film electrode is fixed to a back surface of the polishing layer opposite to the front surface, and is configured to affect movements of the charged abrasive particles through applying an electrical field during the operation of the CMP system. By controlling the movements of the charged abrasive particles relative to the wafer to be processed, removal rates and wafer uniformities are better controlled. For example, if the applied electrical field drives the charged abrasive particles in a direction closer to the wafer to be processed, the removal rate of the wafer material is increased, and so is the polishing efficiency. In contrast, if applying an opposite electrical field which drives the charged abrasive particles in a direction further away from the wafer to be processed, the abrasive particles are less concentrated to the wafer, and thus the polishing uniformity can be improved.

Figure 1:
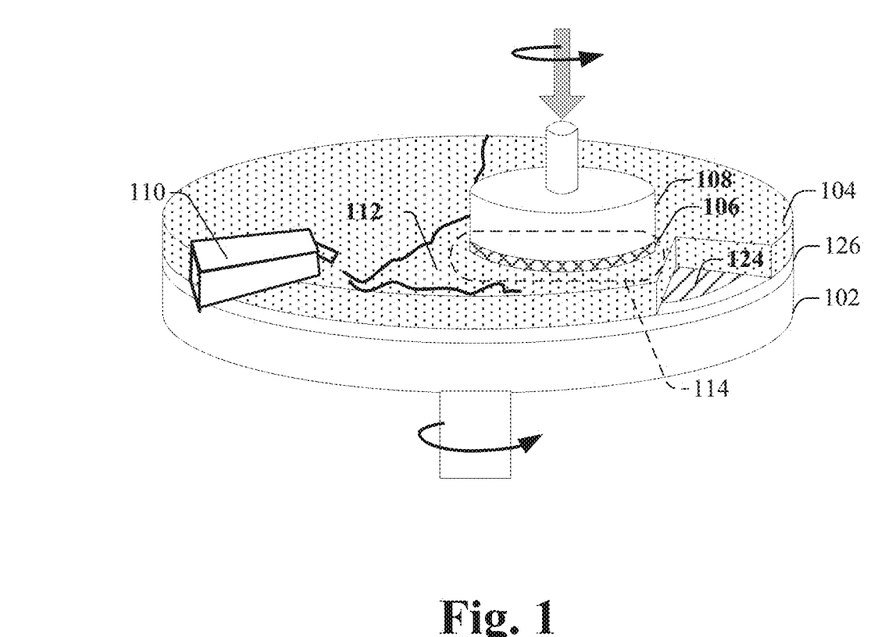
FIG. 1 shows a structural view of a chemical mechanical polishing (CMP) system in accordance with some embodiments.

FIG. 1 shows a structural view of a chemical mechanical polishing (CMP) system 100 in accordance with some embodiments. The CMP system 100 can be utilized to polish metal, semiconductor, or insulator layers, which may include but are not limited to semiconductor thin films, integrated circuit thin films; and/or can be utilized to polish any other films, surfaces, and substrates where a CMP process is applied. As shown in FIG. 1, a rotatable wafer carrier 108 is disposed face down to a rotatable polishing platen 102. The rotatable wafer carrier 108 is utilized to hold a wafer 106 upside down, for example with active device structures face down and near the polishing platen 102. A polishing layer 104 is attached to the rotatable polishing platen 102. A CMP dispenser 110 is disposed above the polishing layer 104 to dispense a slurry 112 to a CMP interface 114 of the polishing layer 104 and the wafer 106. The slurry 112 can comprise chemical compositions to react with the wafer 106 and charged abrasive particles. A film electrode 124 is attached to a back surface of the polishing layer 104. As examples, the film electrode 124 can be made of conductive materials, such as metals (copper, silver, gold, etc. . . . ), graphite, or conductive polymer. In some embodiments, an insulation layer 126 is disposed around the film electrode 124, to protect the film electrode 124 from unwanted exposure. The film electrode 124 is separated from the wafer 106 to be processed by the polishing layer 104. During the operation of the CMP system 100, cyclic motions of both the polishing layer 104 and the wafer 106 are involved. The CMP process combines the chemical conversion of the surface layer removed, with the mechanical removal of the conversion product, which is further illustrated by FIG. 2.

Figure 2:
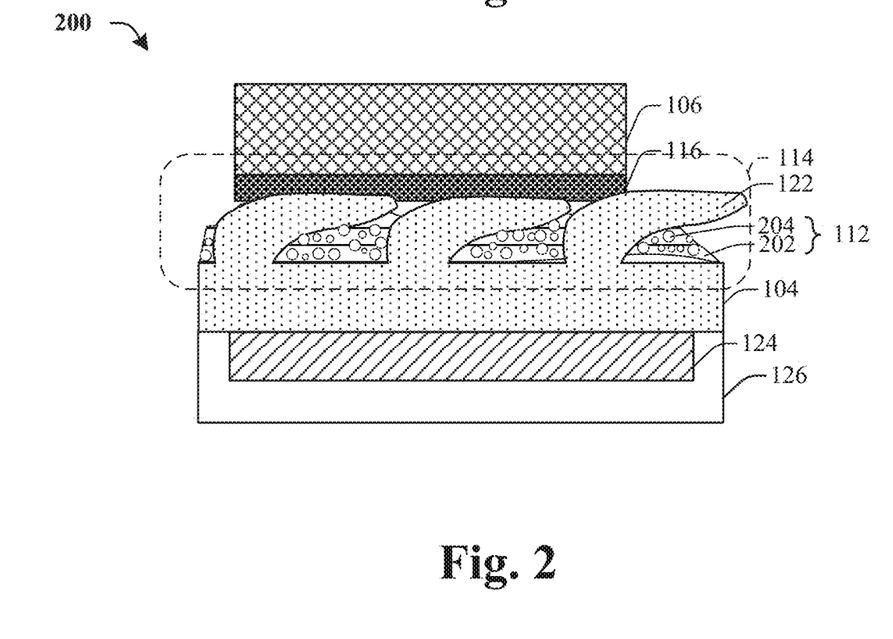
FIG. 2 shows a cross-sectional view of a CMP interface between a wafer to be processed and a polishing layer in accordance with some embodiments.

FIG. 2 shows an enlarged cross-sectional view 200 of the CMP interface 114 of the wafer 106 and the polishing layer 104 shown in FIG. 1 in accordance with some embodiments. As shown in FIG. 2, during the operation of a CMP system, a slurry 112 is applied to the CMP interface 114, including chemical compositions 202 that soften an uppermost portion 116 of a wafer 106, and abrasive particles 204 that remove the uppermost portion 116 and associated byproduct. Among other proper materials, the abrasive particles 204 can comprise a metal oxide, carbide, and/or nitride that are compatible with the other components of the slurry 112 and that provide sufficient polishing rate and performance. The abrasive particles 204 can be selected from a group including aluminum dioxide, zirconium dioxide, germanium dioxide, silicon dioxide, iron (II, III) oxide, ceria, and mixtures thereof. The abrasive particles 204 are charged, and therefore can be moved when an electrical field is applied by biasing the film electrode 124, which will be subsequently described in detail with reference to FIGS. 3-4. In some embodiments, the polishing layer 104 may have asperities 122 protruding from its front surface, which facilitates the removal of the upper most portion 116 of the wafer 106. The insulation layer 126 may cover sidewall and bottom surfaces of the film electrode 124, and have a top surface aligned with a top surface of the film electrode 124. In some embodiments, the top surface of the film electrode 124 is aligned and in direct contact with a bottom surface of the polishing layer 104. The film electrode 124 can be isolated from the slurry 112 and the wafer 106 by the polishing layer 104 during the operation of the CMP system. The polishing layer 104 can be any CMP pad layer(s) that comprise a suitable polymer. For example, the polishing layer 104 may comprise polyurethane. The polishing layer 104 may comprise a microporous urethane film. In some embodiments, asperities 122 are disposed from a top surface of a polymer layer. The asperities 122 are utilized for holding and transporting slurry to and from a surface of the polishing layer 104. The asperities 122 can be distributed in all three dimensions of the polishing layer 104 randomly or uniformly. The asperities 122 can have any suitable density or void volume. In some other embodiments, the asperities 122 can be replaced and/or supplemented by structures such as grooves, channels, apertures, brushes, or combinations thereof disposed in the polishing layer 104. The asperities 122 may be disposed with a protrusion that extends vertically upwards and a member that extends horizontally from top of the protrusion. The asperities 122 help to retain a slurry during a polishing process.

Although FIG. 1, FIG. 2 and other figures below are described in relation to one another, it will be appreciated that each of the figures may stand alone independently. For example, not all components illustrated in FIG. 1 may be required to implement one or more aspects or embodiments of the description of FIG. 2. Further, one or more of the acts depicted herein may be carried out in one or more separate acts and/or phases.

Figure 3:
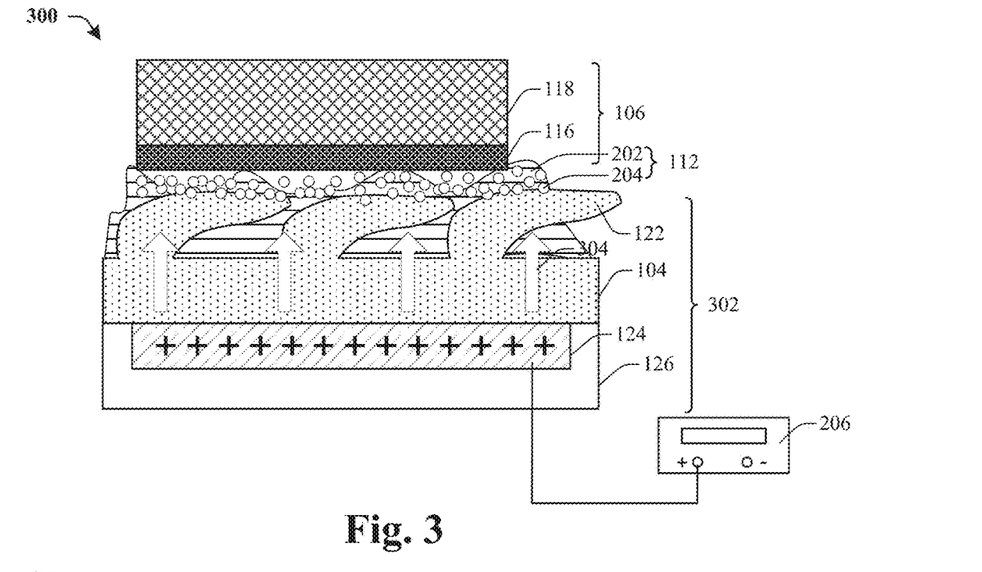
FIG. 3 shows a cross-sectional view of a CMP interface between a wafer to be processed and a polishing layer when a first electrical field is applied in accordance with some embodiments.

FIG. 3 shows a cross-sectional view 300 of a CMP interface between a wafer to be processed and a polishing layer (e.g. the CMP interface 114 shown in FIG. 1 or FIG. 2) when a first electrical field is applied in accordance with some embodiments. As shown in FIG. 3, a wafer 106 is forced down to a front surface of a CMP pad 302 for a planarization process. The CMP pad 302 comprises a polishing layer 104 having asperities 122 protruding from a front surface and a film electrode 124 attached to a back surface. A slurry 112 is applied between the wafer 106 and the CMP pad 302 including chemical compositions 202 and abrasive particles 204. The abrasive particles 204 and the asperities 122 facilitate the removal of the upper most portion 116 of the wafer 106 and associated byproduct during a polishing process. As an example, the film electrode 124 is positively biased by a power supply 206. A first electrical field is generated in a direction pointing out and perpendicular to the film electrode 124, as shown by arrows 304. The abrasive particles 204 are positively charged, and therefore are repelled towards the wafer 106, thereby enhancing the removal process and increasing the removal rate of the upper most portion 116 of the wafer 106.

Figure 4:
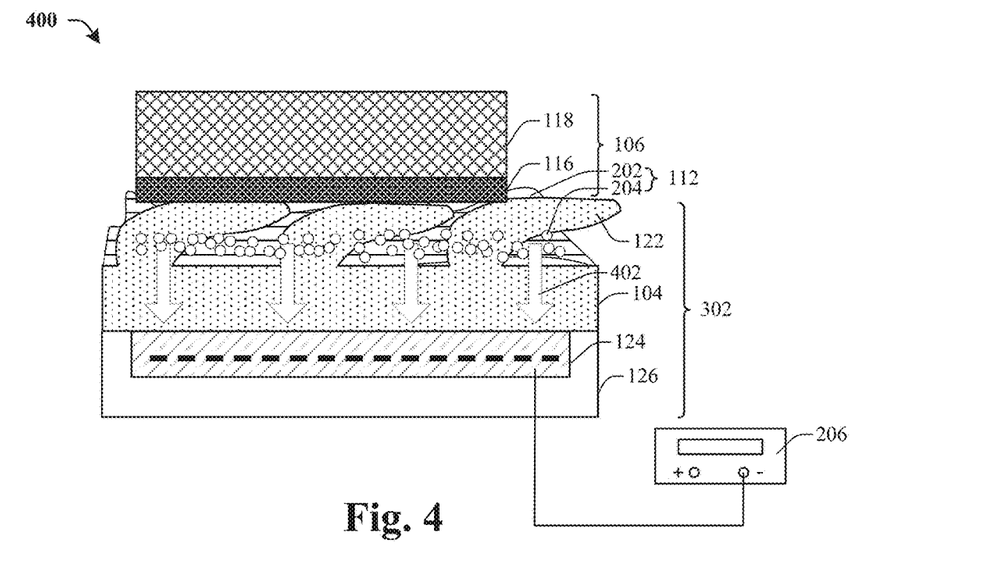
FIG. 4 shows a cross-sectional view of a CMP interface between a wafer to be processed and a polishing layer when a second electrical field opposite to the first electrical field shown in FIG. 3 is applied in accordance with some embodiments.

FIG. 4 shows a cross-sectional view of a CMP interface between a wafer to be processed and a polishing layer (e.g. the CMP interface 114 shown in FIG. 1 or FIG. 2) when a second electrical field opposite to the first electrical field shown in FIG. 3 is applied in accordance with some embodiments. As shown in FIG. 4, compared to the example of FIG. 3, the film electrode 124 is negatively biased by the power supply 206. A second electrical field is generated in a direction pointing into and perpendicular to the film electrode 124, as shown by arrows 402. The second electrical field pulls the abrasive particles 204 away from the wafer 106 to be closer to the film electrode 124, and thereby is less concentrated near the wafer 106 to achieve lower defect density of the polished wafer and better wafer uniformity, albeit while decreasing the removal rate of the upper portion 116 of the wafer 106.

Figure 9:
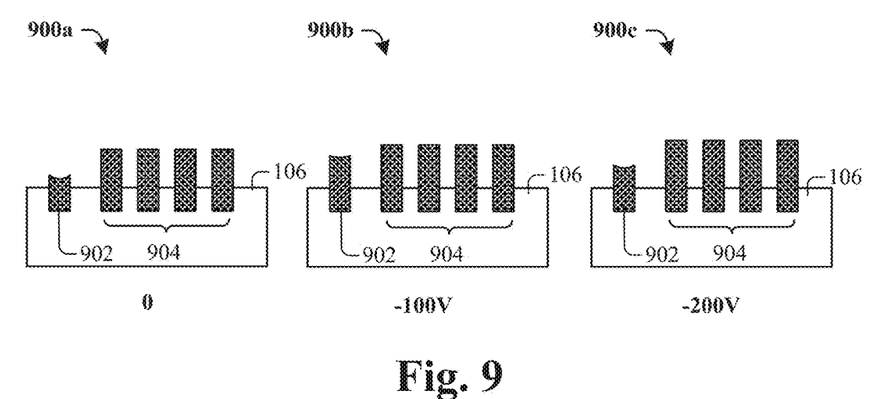
FIG. 9 shows cross-sectional views showing a loading effect introduced to metal structures by different electrical fields of a chemical mechanical polishing (CMP) process in accordance with some embodiments.
Figure 10:
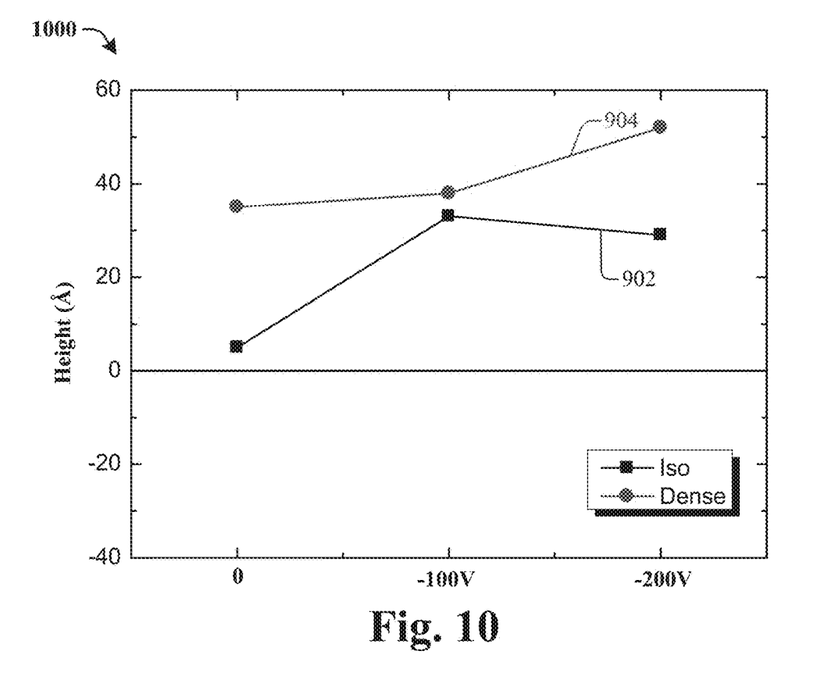
FIG. 10 shows a diagram of heights of metal structures over different electrical fields of a chemical mechanical polishing (CMP) process in accordance with some embodiments.

It is found that the control of the densities of the abrasive particles 204 attacking the wafer 106 affects the loading effect of the metal polishing process. FIG. 9 and FIG. 10 show an example of a loading effect introduced to metal structures by different electrical fields of a chemical mechanical polishing (CMP) process in accordance with some embodiments. As shown in FIG. 9, an isolated metal structure 902 and a dense metal structure 904 are distributed within a wafer 106 that is processed by the CMP process. The dense metal structure 904 can be a plurality of metal components that are arranged closer to one another, while the isolated metal structure 902 can be one or more metal components that are spaced further from one another compared to the dense metal structure 904. The CMP process generates a loading effect to the isolated metal structure 902 and the dense metal structure 904: the isolated metal structure 902 is dished more heavily, and is therefore lower than the dense metal structure 904. The loading effect may introduce defects to the wafer 106, such as insufficient electrical connections. A first cross-sectional view 900a shows a case of the loading effect when no bias is applied to the film electrode (e.g. the film electrode 124 shown in FIGS. 1-4) attached to the CMP pad. A second cross-sectional view 900b shows a case of the loading effect when a first bias (−100V) is applied to the film electrode. A third cross-sectional view 900c shows a case of the loading effect when a second bias (−200V) higher than the first bias is applied to the film electrode. FIG. 10 correspondingly shows remaining heights of the isolated metal structure 902 and the dense metal structure 904 over the above applied biases. As shown in FIG. 9 and FIG. 10, the isolated metal structure 902 is least dished under the first bias −100V. During CMP operation, the amount of dishing can be measured and/or predicting based on a model, and the bias applied to the electrode can be varied in time to limit dishing.

Figure 5:
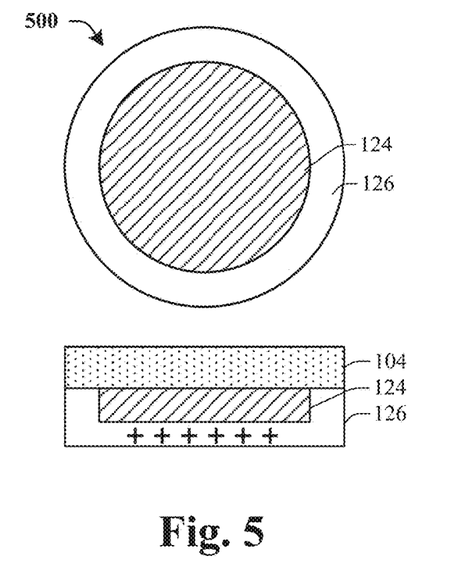
FIG. 5 shows top view and cross-sectional view of a CMP pad including a film electrode attached to a back surface of a polishing layer in accordance with some embodiments.

FIG. 5 shows top view and cross-sectional view of a CMP pad 500 including a film electrode 124 attached to a back surface of a polishing layer 104 in accordance with some embodiments. The film electrode 124 is attached to a back surface of the polishing layer 104. The film electrode 124 can be a continuous integral that is uniformly pasted onto a central region of the back surface of the polishing layer 104. The film electrode 124 comprises a round shaped component that is concentric to the polishing layer 104 with a diameter smaller than that of the polishing layer 104. During a CMP process, the film electrode 124 is configured to be positively biased as noted in the FIG. 5, or negatively biased, depending on the application. In some embodiments, the bias voltage can be in a range of from about −500V to about 500V. In some embodiments, the film electrode 124 is covered and protected by an insulation layer 126. The insulation layer 126 can be a polyester layer. The insulation layer 126 may comprise polyurethane impregnated into a polyester non-woven fabric. The insulation layer 126 can be used as a base material coated by the microporous urethane film. The insulation layer 126 can also function as a base plate layer that helps to support the polishing layer 104 and improve CMP performance. The insulation layer 126 can be either harder or softer than the polishing layer 104. The insulation layer 126 can be a solid, non-porous layer.

Figure 6:
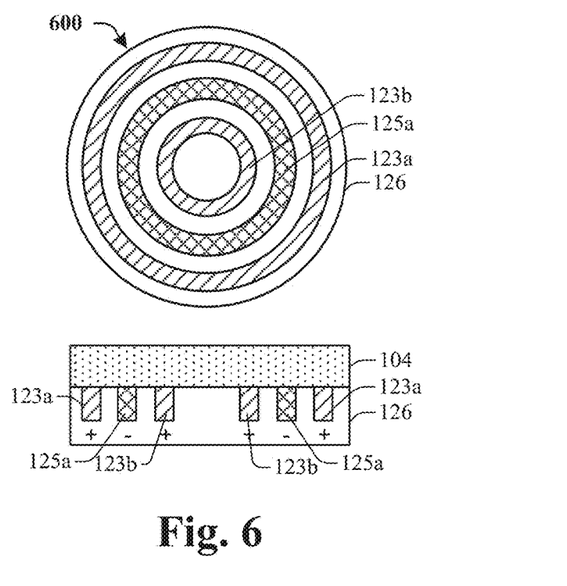
FIG. 6 shows top view and cross-sectional view of a CMP pad including a film electrode attached to a back surface of a polishing layer in accordance with some alternative embodiments.

FIG. 6 shows top view and cross-sectional view of a CMP pad 600 including a film electrode 124 attached to a back surface of a polishing layer 104 in accordance with some alternative embodiments. The film electrode 124 comprises a first plurality of circular rings 123a, 123b, . . . , and a second plurality of circular rings 125a, . . . , concentric to the polishing layer 104 and staggered arranged. The first plurality of circular rings 123a, 123b and the second plurality of circular rings 125a can be equally spaced from one another. The first plurality of circular rings 123a, 123b and the second plurality of circular rings 125a are configured to be connected to opposite polarities of a power supply. For example, the first plurality of circular rings 123a, 123b can be positively biased by being connected to an anode of a power supply, and the second plurality of circular rings 125a can be negatively biased by being connected to a cathode of the power supply, or another power supply, or vice versa. In some embodiments, a voltage difference applied to the first plurality of circular rings 123a, 123b and the second plurality of circular rings 125a can be in a range of from about −500V to about 500V. In some embodiments, each circular ring can have a radial thickness of between 100 micrometers and 10 millimeters, and the radial spacing separating nearest sidewalls of neighboring rings ranges from 100 micrometers to 10 millimeters.

Figure 7:
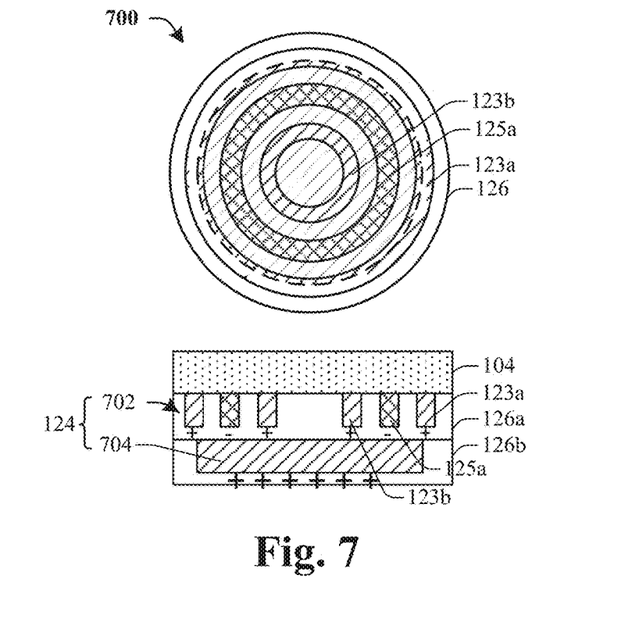
FIG. 7 shows top view and cross-sectional view of a CMP pad including a film electrode attached to a back surface of a polishing layer in accordance with some alternative embodiments.

FIG. 7 shows top view and cross-sectional view of a CMP pad 700 including a film electrode 124 attached to a back surface of a polishing layer 104 in accordance with some alternative embodiments. The film electrode 124 comprises an upper conductive layer 702 in direct contact with the polishing layer 104, and a lower conductive layer 704 away from the polishing layer 104. A first insulation layer 126a separates the upper conductive layer 702 from the lower conductive layer 704. A second insulation layer 126b covers and protects the lower conductive layer 704. The upper conductive layer 702 comprises a first plurality of components 123a, 123b, . . . , and a second plurality of components 125a, . . . , staggered arranged and configured to be connected to opposite polarities of a power supply, while the lower conductive layer 704 is integrally coupled to one polarity of the power supply. In some embodiments, a voltage difference applied to the first plurality of circular rings 123a, 123b and the second plurality of circular rings 125a can be same or different from a voltage applied to the upper conductive layer 702.

Figure 8:
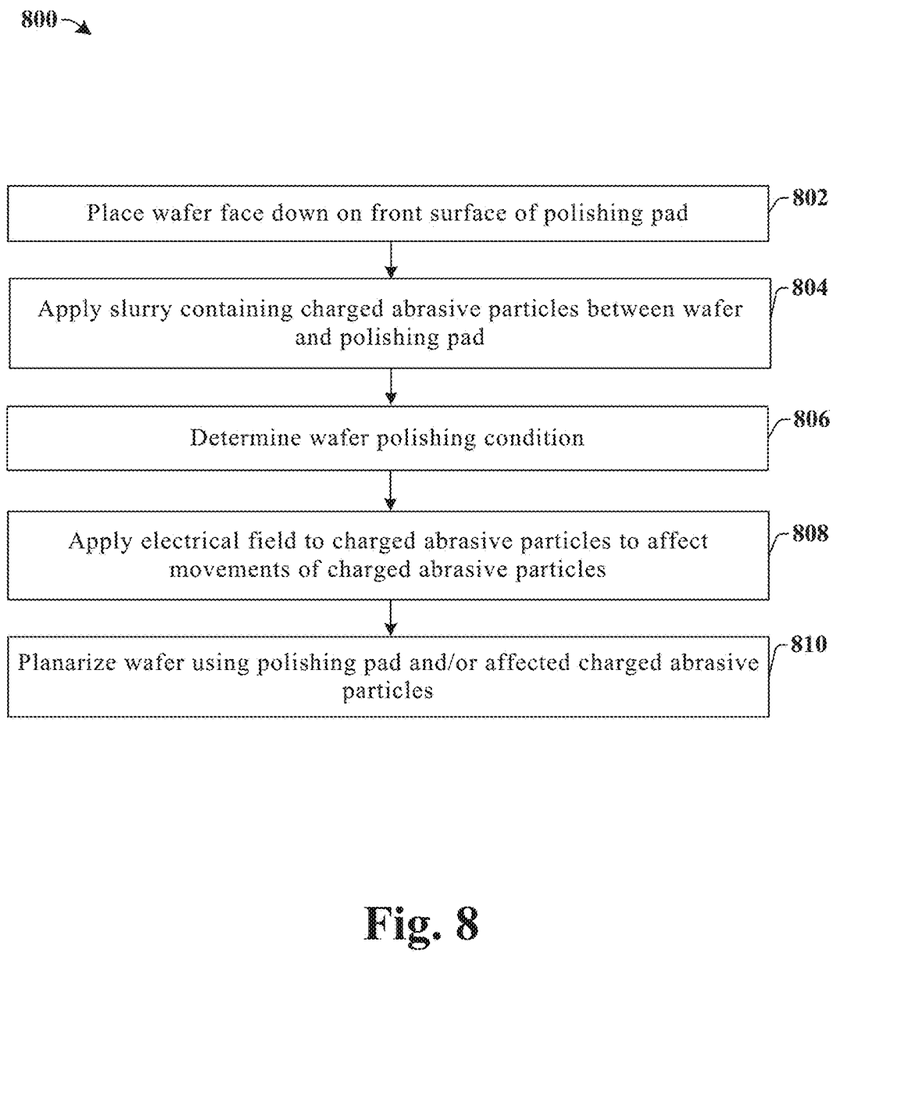
FIG. 8 shows a flow diagram of a method of chemical mechanical polishing (CMP) in accordance with some embodiments.

FIG. 8 shows a flow diagram of a method 800 of chemical mechanical polishing (CMP) in accordance with some embodiments. The method 800 can be configured to planarize a wide variety of wafer structures. Exemplary wafer structures include, but are not limited to: Al wiring, Cu wiring, W wiring, and the like. While disclosed methods (e.g., method 800) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 802, a wafer is placed face down on a front surface of a polishing layer. The wafer can be held by a wafer carrier which can include a plurality of variable-pressure chambers (not shown) for exerting either suction or pressure onto backside of the wafer. For example, FIG. 1 illustrates some embodiments of a cross-sectional view showing placing a wafer 106 face down on a front surface of a polishing layer 104 corresponding to act 802.

At act 804, a slurry is applied between the wafer and the polishing layer. The slurry contains charged abrasive particles. The slurry comprises an abrasive to mechanically remove an uppermost portion of the wafer and a chemical to dissolve the uppermost portion of the wafer. In various embodiments, the slurry is comprised of slurry particles present during polishing. In various embodiments, the slurry particles are comprised of silica (SiO2) or alumina (Al2O3), depending on the surface to be polished. For example, FIG. 1 illustrates some embodiments of a cross-sectional view showing applying a slurry 112 between the wafer 106 and the polishing layer 104.

At act 806, optionally, a wafer polishing condition is determined by a monitoring process. The methods of the present invention may be implemented in association with various types of monitoring components and systems, and any such system or group of components, either hardware and/or software, incorporating such a method is contemplated as falling within the scope of the present invention. The monitoring process for example, can be realized by applying a pad probe or optical scan over the wafer surface. In some embodiments, the wafer removal rate and/or the wafer removal uniformity are detected. It may be determined that whether the wafer removal rate and/or the wafer removal uniformity are in the desired regions. An electrical field application decision is then made accordingly. Such a decision can be made manually or using a pre-set computer program.

At act 808, an electrical field is applied to the charged abrasive particles to affect movements of the charged abrasive particles. In some embodiments, the electrical field is applied vertically between the front surface of the polishing layer and the wafer to move the charged abrasive particles closer to the wafer to increase a removal rate. In some other embodiments, the electrical field is applied vertically between the wafer and the front surface of the polishing layer to move the charged abrasive particles further away from the wafer to reduce loading effect. In some embodiments, the electrical field is applied by biasing a film electrode attached to the polishing layer. In some embodiments, the film electrode is uniformly pasted onto a central region of the back surface of the polishing layer and having its sidewall and bottom surfaces covered by an insulation layer. For example, FIG. 5 shows an example of such a film electrode. In some other embodiments, the film electrode is formed including a first plurality of components and a second plurality of components of the film electrode are staggered arranged and connected to opposite polarities of a power supply. For example, FIG. 6 shows an example of such a film electrode. As illustrated above, the biasing voltage may be determined at act 808 according to polishing conditions, or pre-determined depending on varies applications before the polishing process.

At act 812, the wafer is planarized using the polishing pad and/or the affected charged abrasive particles. The wafer is planarized by applying a pressure between the wafer and the CMP pad through a wafer carrier, while the electrical field is applied. A general-purpose controller allows a variable down-force to be applied to the wafer carrier and a polishing platen to be rotated at variable and independent rates, and allows the slurry and/or other materials to be applied to the polishing layer attached on the polishing platen. During operation, the wafer carrier is preferably rotated about spindle axis at a desired rate while the polishing platen is preferably rotated around the platen axis at an independent desired rate. The wafer is planarized by chemically softening and/or mechanically dislocating an uppermost excessive portion of the wafer using the polishing layer and/or the charged abrasive particles that are affected by the applied electrical field. The combined action of the down-force of the wafer carrier, the respective rotations of the wafer carrier and the polishing platen, the chemical and mechanical effects of the slurry, and the abrasive particle pulling and/or repelling effects of the electrical field combine to polish the surface of the wafer to a desired planarity and thickness. The electrical field can be changed, for example, increased, decreased, or flipped from positive to negative or vice versa, while pressure is applied between the wafer and the CMP pad to fine tune the polishing process. For example, the polishing conditions can be monitored in real time or at pre-determined time intervals, and the biasing voltages and its controlled electrical field can be adjusted based on the monitoring result.

The wafer carrier is removed from the top of the CMP pad and released the wafer after planarization. The CMP pad is cleaned by applying an aqueous solution. The deformed pad is generally subjected to a high-pressure spray of deionized water or other proper chemical solutions to remove slurry residue and other particulate matter from the pad. Other particulate matter may include wafer residue, CMP slurry, oxides, organic contaminants, mobile ions and metallic impurities. A repeated process of act 806, act 808, and act 810 may be performed to achieve desired polishing goal. For example, FIG. 1 illustrates some embodiments of a cross-sectional view showing applying a pressure between the wafer 106 and the polishing layer 104 and performing the planarization process.

The present disclosure is related to optimize CMP techniques that introduce an electrical field to affect charged abrasive particles of a slurry. In some embodiments, a CMP pad comprises a polishing layer and a film electrode attached to a back surface of the polishing layer such that an electrical field can be applied when biasing the film electrode. The CMP removal rate and removal uniformity can be improved by controlling the applied electrical field. As a result, a better quality and/or a higher efficiency of the CMP are achieved.

Some embodiments relate to a chemical mechanical polishing (CMP) system. The chemical mechanical polishing (CMP) system comprises a rotatable wafer carrier configured to hold a wafer face down to be processed. The CMP system further comprises a polishing layer attached to a polishing platen and having a front surface configured to interact with the wafer to be processed. The CMP system further comprises a CMP dispenser configured to dispense a slurry between an interface of the polishing layer and the wafer. The slurry contains charged abrasive particles therein. The CMP system further comprises a film electrode attached to a back surface of the polishing layer opposite to the front surface. The film electrode is configured to affect movements of the charged abrasive particles through applying an electrical field during the operation of the CMP system.

Other embodiments relate to a method of chemical mechanical polishing. In this method, a wafer is placed face down on a CMP pad. Then a slurry containing charged abrasive particles is applied between the wafer and the CMP pad. Then an electrical field to the charged abrasive particles to affect movements of the charged abrasive particles. Then the wafer is planarized by chemically softening and/or mechanically dislocating an uppermost excessive portion of the wafer using the polishing layer and/or the charged abrasive particles.

Still other embodiments relate to a chemical mechanical polishing (CMP) pad. The CMP pad comprises a polishing layer having a front surface with protruding asperities while a back surface being planar. The CMP pad further comprises a film electrode attached to the back surface of the polishing layer. The CMP pad further comprises an insulating layer covering sidewall and bottom surfaces of the film electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chemical mechanical polishing (CMP) system, comprising:
   a rotatable wafer carrier configured to hold a wafer face down to be processed;
   a polishing layer attached to a polishing platen and having a front surface configured to interact with the wafer to be processed;
   a CMP dispenser configured to dispense a slurry between an interface of the polishing layer and the wafer, the slurry containing charged abrasive particles therein; and
   a film electrode attached to a back surface of the polishing layer opposite to the front surface, and configured to affect movements of the charged abrasive particles through applying an electrical field during an operation of the CMP system;
   wherein the film electrode comprises a first plurality of circular rings and a second plurality of circular rings concentric to the polishing layer and staggered arranged.

2. The CMP system of claim 1, wherein the film electrode is provided onto a central region of the back surface of the polishing layer and wherein the film electrode has sidewall and bottom surfaces covered by an insulation layer.

3. The CMP system of claim 1, wherein the film electrode is isolated from the slurry and the wafer to be processed by the polishing layer during the operation of the CMP system.

4. The CMP system of claim 1, wherein the film electrode comprises a round shaped component that is concentric to the polishing layer with a diameter smaller than that of the polishing layer.

5. The CMP system of claim 4, wherein the film electrode is configured to be coupled to an anode of a power supply while the abrasive particles are positive charged.

6. The CMP system of claim 1, wherein the first plurality of circular rings and the second plurality of circular rings are configured to be connected to opposite polarities of a power supply.

7. The CMP system of claim 1, wherein the film electrode comprises an upper conductive layer in direct contact with the polishing layer, and a lower conductive layer away from the polishing layer, wherein an insulation layer separates the upper conductive layer from the lower conductive layer.

8. The CMP system of claim 7, wherein the upper conductive layer comprises a first plurality of components and a second plurality of components staggered arranged and configured to be connected to opposite polarities of a power supply, while the lower conductive layer is integrally coupled to one polarity of the power supply.

9. The CMP system of claim 1, wherein the film electrode comprises copper, silver, graphite, or conductive polymer.

10. The CMP system of claim 1, wherein the front surface of the polishing layer comprises protruding asperities while the back surface of the polishing layer is planar.

11. A chemical mechanical polishing (CMP) system, comprising:
    a polishing layer attached to a polishing platen and configured to polish a facing down wafer that interacts with a front surface of the polishing layer;
    a slurry containing charged abrasive particles between the wafer and the polishing layer; and
    a film electrode attached to a back surface of the polishing layer opposite to the front surface and configured to apply an electrical field to attract the charged abrasive particles towards the polishing layer during a CMP operation;
    wherein the film electrode comprises an upper conductive layer close to the polishing layer and a lower conductive layer away from the polishing layer, wherein an insulation layer separates the upper conductive layer from the lower conductive layer.

12. The CMP system of claim 11, wherein one of the upper conductive layer and the lower conductive layer comprises a round shaped continuous integral that is uniformly pasted onto a central region of the back surface of the polishing layer and is concentric to the polishing layer.

13. The CMP system of claim 12, wherein the other one of the upper conductive layer and the lower conductive layer comprises a first plurality of components and a second plurality of components staggered arranged and connected to opposite polarities of a power supply.

14. The CMP system of claim 12, further comprising:
    a continuous insulation layer covering sidewall and bottom surfaces of the round shaped continuous integral of the film electrode;
    wherein the continuous insulation layer has an outer sidewall aligned with an outer sidewall of the polishing layer.

15. The CMP system of claim 11, wherein the electrical field is concurrently applied with a pressure between the wafer and the polishing layer applied through a wafer carrier.

16. The CMP system of claim 11, wherein the electrical field applied by the film electrode varies in time during the CMP operation.

17. The CMP system of claim 11, wherein the film electrode is separated from the wafer by the polishing layer.

18. A chemical mechanical polishing (CMP) system, comprising:
    a polishing layer attached to a polishing platen and configured to polish a facing down wafer that interacts with a front surface of the polishing layer, the polishing layer having a front surface with protruding asperities while a back surface being planar;
    a slurry containing charged abrasive particles configured to be applied between the wafer and the polishing layer;
    a film electrode attached to the back surface of the polishing layer and configured to apply an electrical field to affect movements of the charged abrasive particles during a CMP operation; and
    an insulating layer covering sidewall and bottom surfaces of the film electrode;

wherein the film electrode comprises an upper conductive layer comprising a first plurality of components and a second plurality of components staggered arranged and configured to be connected to opposite polarities of a power supply.

19. The CMP system of claim 18, wherein the film electrode further comprises a lower conductive layer away from the polishing layer, the lower conductive layer being integrally coupled to one polarity of the power supply.

20. The CMP system of claim 19, wherein the insulation layer includes a first portion separates the upper conductive layer from the lower conductive layer and a second portion covers and protects the lower conductive layer.

* * * * *